US008652391B2

(12) United States Patent
Bhatt

(10) Patent No.: US 8,652,391 B2
(45) Date of Patent: Feb. 18, 2014

(54) METHOD OF FORMING SUBSTRATE CARRIERS AND ARTICLES FROM COMPOSITIONS COMPRISING CARBON NANOTUBES

(75) Inventor: Sanjiv M. Bhatt, Minnetonka, MN (US)

(73) Assignee: Entegris, Inc., Billerica, MA (US)

( * ) Notice: Subject to any disclaimer, the term of this patent is extended or adjusted under 35 U.S.C. 154(b) by 803 days.

(21) Appl. No.: 11/509,419

(22) Filed: Aug. 23, 2006

(65) Prior Publication Data

US 2013/0341835 A1 Dec. 26, 2013

Related U.S. Application Data

(63) Continuation-in-part of application No. PCT/US2005/003220, filed on Feb. 3, 2005.

(60) Provisional application No. 60/775,569, filed on Feb. 22, 2006.

(51) Int. Cl.
*B29B 7/00* (2006.01)
*B29C 45/00* (2006.01)
*B29C 45/14* (2006.01)

(52) U.S. Cl.
USPC ........ 264/328.18; 264/259; 427/58; 977/748; 977/750; 977/753

(58) Field of Classification Search
None
See application file for complete search history.

(56) References Cited

U.S. PATENT DOCUMENTS

| | | | | |
|---|---|---|---|---|
| 4,094,849 A | * | 6/1978 | Oyamada et al. | ............ 524/819 |
| 5,236,645 A | * | 8/1993 | Jones | .............................. 264/78 |
| 5,707,916 A | | 1/1998 | Snyder et al. | |
| 6,205,016 B1 | | 3/2001 | Niu | |
| 6,331,262 B1 | | 12/2001 | Haddon et al. | |
| 6,331,265 B1 | | 12/2001 | Dupire et al. | |
| 6,426,134 B1 | | 7/2002 | Lavin et al. | |

(Continued)

FOREIGN PATENT DOCUMENTS

| | | |
|---|---|---|
| WO | WO 00/17101 A1 | 3/2000 |
| WO | WO 01/57284 A1 | 8/2001 |
| WO | WO 02/055769 A1 | 7/2002 |
| WO | WO03/079375 | 9/2003 |

OTHER PUBLICATIONS

Andrews R. et al., Fabrication of Carbon Multiwall Nanotube/Polymer Composites by Shear Mixing, Macromolecular Materials and Engineering, Jun. 28, 2002, vol. 287, Issue 6, pp. 395-403.*

(Continued)

*Primary Examiner* — Benjamin Schiffman
(74) *Attorney, Agent, or Firm* — Christensen Fonder P.A.

(57) ABSTRACT

Substrate containers formed from improved compositions comprise a polymer and carbon nanotubes to provide enhanced characteristics. In some embodiments, the carbon fibers, e.g., nanotubes, can be mechanically blended or incorporated into the polymer, while in some embodiments carbon nanotubes also may be covalently bonded to the polymer to form corresponding covalent materials. In particular, the polymer can be covalently bonded to the side walls of the carbon nanotubes to form a composite with particularly desirable mechanical properties. The processing of the nanotubes can be facilitated by the dispersion of the nanotubes in an aqueous solution comprising a hydrophylic polymer, such as ethyl vinyl acetate. A dispersion of nanotubes can be combined with a polymer in an extrusion process to blend the materials under high shear, such as in an extruder.

10 Claims, 2 Drawing Sheets

(56) References Cited

U.S. PATENT DOCUMENTS

| | | | |
|---|---|---|---|
| 6,428,729 | B1 | 8/2002 | Bhatt et al. |
| 6,503,653 | B2 | 1/2003 | Rock |
| 6,528,572 | B1 | 3/2003 | Patel et al. |
| 6,531,513 | B2 | 3/2003 | Haddon et al. |
| 6,677,071 | B2 | 1/2004 | Yang |
| 6,683,783 | B1 | 1/2004 | Smalley et al. |
| 6,764,628 | B2 | 7/2004 | Lobovsky et al. |
| 6,986,876 | B2 | 1/2006 | Smalley et al. |
| 2001/0031900 | A1 | 10/2001 | Margrave et al. |
| 2002/0068170 | A1 | 6/2002 | Smalley |
| 2003/0151030 | A1 | 8/2003 | Gurin |
| 2003/0158323 | A1 | 8/2003 | Connell |
| 2003/0213939 | A1 | 11/2003 | Narayan et al. |
| 2004/0071624 | A1 | 4/2004 | Tour et al. |
| 2005/0186378 | A1* | 8/2005 | Bhatt ............ 428/36.9 |
| 2010/0267883 | A1 | 10/2010 | Bhatt |

OTHER PUBLICATIONS

Zhu et al., Reinforcing Epoxy Polymer Composites Through Covalent Integration of Functionalized Nanotubes, Advanced Functional Materials, vol. 14, Issue 7, pp. 643-648, Jul. 22, 2004, http://dx.doi.org/10.1002/adfm.200305162.*

Zhu et al., Improving the Dispersion and Integration of Single-Walled Carbon Nanotubes in Epoxy Composites through Functionalization, Nano Letters, vol. 3, No. 8, pp. 1107-1113, Jun. 26, 2003, http://dx.doi.org/10.1021/nl0342489.*

Stevens et al., Sidewall Amino-Functionalization of Single-Walled Carbon Nanotubes through Fluorination and Subsequent Reactions with Terminal Diamines, Nano Letters, vol. 3, No. 3, pp. 331-336, Jan. 28, 2003, http://dx.doi.org/10.1021/nl025944w.*

Dyke et al., Covalent Functionalization of Single-Walled Carbon Nanotubes for Materials Applications, The Journal of Physical Chemistry A, vol. 108, No. 51, pp. 11151-11159, Nov. 26, 2004, http://dx.doi.org/10.1021/jp046274g.*

Abstract for R. Andrews et al., "Multiwall Carbon Nanotubes: Synthesis and Composite Applications."

Abstract for Kumar, "Films, Fibers, and Coatings from Carbon Nano Tubes, Nano Fibers, and their Composites with Polymers."

Abstract for Ying et al., "Study on Relationship of Mechanical Properties with Microstructure of PA6/Carbon Nano-Tube Composites."

Bahr et al., "Dissolution of Small Diameter Single-Wall Carbon Nanotubes in Organic Solvents?," Chem. Commun., 2001, pp. 193-194.

Kong et al., "Synthesis, Integration, and Electrical Properties of Individual Single-Walled Carbon Nanotubes," Appl. Phys. A 69, 305-308 (1999).

Hu et al., "Determination of the Acidic Sites of Purified Single-Walled Carbon Nanotubes by Acid-Base Titration," Chemical Physics Letters 345 (2001) 25-28.

Kuznetsova et al., "Oxygen-Containing Functional Groups on Single-Wall Carbon Nanotubes: NEXAFS and Vibrational Spectroscopic Studies," J. Am. Chem. Soc. 2001, 123, 10699-10704.

O'Loughlin et al., "Rapid Synthesis of Carbon Nanotubes by Solid-State Metathesis Reactions," J. Phys. Chem. B 2001, 105, 1921-1924.

Riggs et al., "Strong Luminescence of Solubilized Carbon Nanotubes," J. Am. Chem. Soc. 2000, 122, 5879-5880.

Rinzler et al., "Large-Scale Purification of Single-Wall Carbon Nanotubes: Process, Product, and Characterization," Appl. Phys. A 67, 29-37 (1998).

Teo et al., "Catalytic Synthesis of Carbon Nanotubes and Nanofibers," Encyclopedia of Nanoscience and Nanotechnology, vol. X, 1-6.

Wei et al., "Tensile Strength of Carbon Nanotubes Under Realistic Temperature and Strain Rate," Physical Review B 67, 115407 (2003).

Wong et al., "Covalently Functionalized Nanotubes as Nanometre-Sized Probes in Chemistry and Biology," Nature, vol. 394, 52-55 (Jul. 1998).

Kharchenko et al.,"Flow Induced Properties of Nanotube-filled Polymer Materials" Nature Materials, vol. 3, pp. 564-568. Aug. 2004. Online: http://www.nature.com/nmat/journal/v3/n8/abs/nmat183.html.

Lake et al., "CNF Re-Inforced Polymer Compositions", AIP Conference Proceedings. vol. 723. pp. 455-459. Sep. 29, 2004. Online: http://link.aip.org/link/?APCPCS/723/455/1.

Ritschel et al, "Synthesis and characterization of carbon nanostructures", Highlights, 2000, pp. 23-26.

Shaffer et al., "Carbon Nanotube and Nanfibre Reinforeced Polyamide-12 Fibres". Mat. Res. Soc. Symp. Proc. (2004) vol. 791, Q10.4.1-Q10.4.6.

Sandler et al., "Carbon-nonofibre-reinforeced poly (ether ether ketone) Fibres". J. of Mat. Sci., 38 (2003) 2135-2141.

Ramanathan et al., "Functionalized SWNT/Polymer Nanocomposites for Dramatic Property Improvement" J. of Poly. Sci., Part B: Polymer Physics (2005), vol. 43, 2269-2279.

Ferguson et al., "ESD Thermoplastic Product Offers Advantages for Demanding Electronic Applications" ANTEC '98, 1219-1222.

Barraza et al, "SWNT-Filled Thermoplastic and Elastomeric Composites Prepared by Miniemulsion Polymerization", Nano Lett. vol. 2, No. 8. pp. 797-802 (2002).

Potschke et al., Polymer 43, 3247-3255 (2002), "Rheological Behavior of Mulitwalled Carbon Nanotube/Polycarbonate Composites".

Sandler et al., Composites: Part A 33, 1033-1039 (2002), "Carbon-nanofibre-reinforeced poly (ether ether ketone) Composites".

Andrews et al., Appl. Phys. Lett., vol. 75, No. 9, 1329-1331 (1999) "Nanotube Composite Carbon Fibres".

Sennett et al., Mat. Res. Soc. Symp. Proc., vol. 706, 97-102 (2002), "Dispersion and Alignment of Carbon Nanotubes in Polycarbonate".

Tibbetts et al., Mat. Res. Sco. Symp. Proc. vol. 733E, 35-39 (2002), "Carbon Nanofiber Reinforced Composites for Enhanced Conductivity, Strength, and Tensile Modulus".

King et al., Polymer Composites. vol. 22, No. 1, 142-154, (Feb. 2001), "Factorial Design Approach Applied to Electically and Thermally Conductive Nylon 6,6."

Barrera, JOM. 38-42, (Nov. 2000), "Key Methods for Developing Single-Wall Nanotube Composites".

Lozano, JOM 34-36, (Nov. 2000), "Vapor-Grown Carbon-Fiber Composites: Processing and Electrostatic Dissipative Applications".

Carneiro et al., Polymer Composites, vol. 21, No. 6, 960-969 (Dec. 2000), "Rheological Behavior of (Short) Carbon Fiber/Thermoplastic Composites. Part I: The Influence of Fiber Type, Processing Conditions and Level of Incorporation".

Schwartz et al., ANTEC '95, 1358-1361 (1995), "Electronic Dissipating Composites Containing Graphite Microfibers".

Lillehei et al., Nano Lett. vol. 2, No. 8, 827-829 (2002), "Imaging Carbon Nanotubes in High Performance Polymer Composites via Magnetic Force Microscopy".

Application and File HIstory for U.S. Appl. No. 12/087,914, filed Jul. 17, 2008, inventor Bhatt.

Application and File HIstory for U.S. Appl. No. 12/784,322, filed Feb. 23, 2004, inventor Bhatt.

* cited by examiner

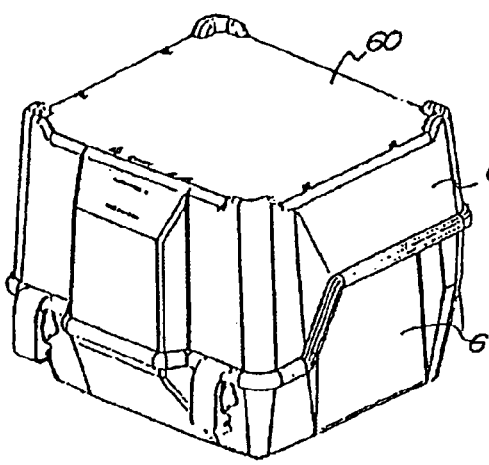
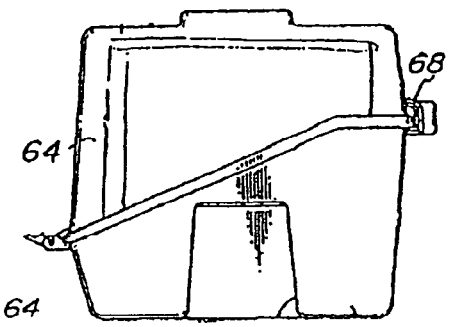
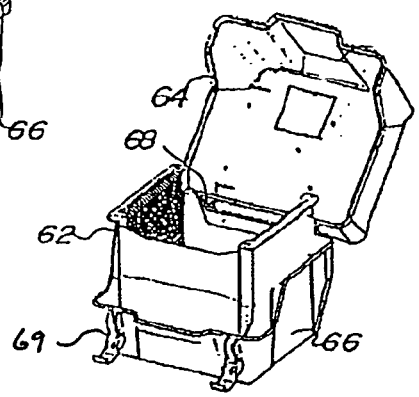
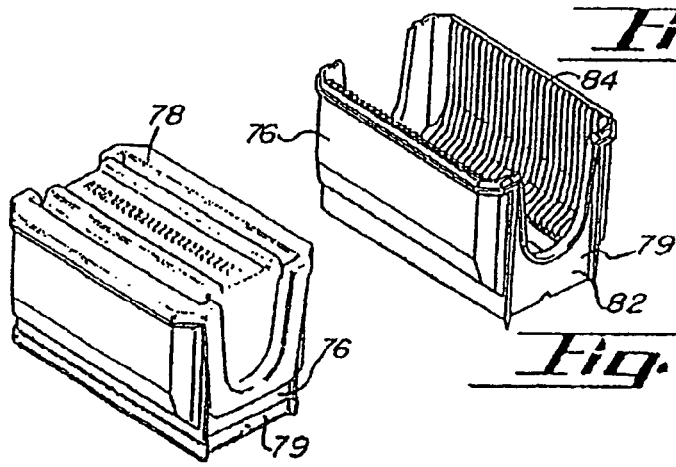

METHOD OF FORMING SUBSTRATE CARRIERS AND ARTICLES FROM COMPOSITIONS COMPRISING CARBON NANOTUBES

CROSS REFERENCE TO RELATED PATENT APPLICATIONS

This application is a continuation-in-part of copending international patent application PCT/US2005/003220 entitled "Compositions Comprising Carbon Nanotubes and Articles Formed Therefrom" filed Feb. 3, 2005, which claims priority to U.S. patent application Ser. No. 10/784,322, filed Feb. 23, 2004; this application also claims priority to U.S. Patent Application No. 60/775,569, entitled "Nanotube Polymer Composite Compositions and Methods of Making" filed Feb. 22, 2006. The entire disclosures of the prior applications are considered as being part of the disclosure of this application and are hereby incorporated by reference herein.

FIELD OF THE INVENTION

This invention relates to articles, such as substrate carriers or functional articles such as bipolar plates, that are formed from the compositions comprising polymers. Additionally, the invention also relates to methods of making the articles.

BACKGROUND OF THE INVENTION

Technological developments impose increasing demands on material properties to achieve desired objectives. On the other hand, improved material capabilities correspondingly can provide improved performance capabilities for corresponding products that incorporate the improved materials. Furthermore, composite materials have been found to be a way to combine desired properties of different compositions to obtain a material that benefits from the properties of the plurality of compositions.

Carbon fibers generally have been formed with a range of properties and morphologies. In particular, carbon nanotubes, which are generally cylindrical forms of graphitic carbon, exhibit useful mechanical and electrical properties including, for example, large tensile strength and large electrical conductivity. Carbon nanotubes can exist in single wall and multiple wall forms, both of which can be prepared by chemical vapor deposition (CVD) techniques. In general, process conditions such as, for example, deposition temperature and catalyst selection can influence the formation of the different structures. Additionally, carbon nanotubes can be electrically conducting or semiconducting, depending on structure.

Advanced products may require special handling approaches due to the sensitivity of the products to damage and degradation. In particular, some products, such as semiconductor devices, silicon wafers, reticles and masks for manufacturing semiconductors, and the like, can be damaged during transportation, handling, and/or processing, for example, as a result of the products contacting each other or contacting supporting structure. Consequently, specialized substrate containers have been developed to transport these products. These specialized containers can be formed, for example, from molded thermoplastic materials, which have structure suitable for holding a plurality of products in a desired orientation within the container. The interior structure of these containers typically prevents the products from contacting each other, and thus helps reduce product damage that can occur during transportation of the products. Moreover, containers and carriers in the semiconductor processing industry often have conductive or static dissipative characteristics to prevent damage to substrates or components in the carrier.

Some articles have high electrical conductivities to appropriately function in their applications. Specifically, a range of components delivers high electrical conductivity within a corresponding device. For example, many electrical generation units incorporate electrically conductive elements. In particular, fuel cells can have bipolar plates that provide electrical conduction between neighboring cells connected in series while simultaneously providing for flow of fuels and oxidizing agents and preventing material flow between the neighboring cells. Similarly, many battery structures incorporate electrically conductive elements to facilitate electrical connection of the battery poles with the battery electrodes.

SUMMARY OF THE INVENTION

In a first aspect, the invention pertains to an article such as a substrate container with portions formed from a composition comprising a polymer with nanotubes therein. A second aspect pertains to such articles with a polymer covalently bonded to the side walls of carbon nanotubes. Additionally, the invention pertains to an article such as a fuel cell with portions such as bipolar plates formed from a composition comprising a polymer covalently bonded to the side walls of carbon nanotubes.

In another aspect, the invention pertains to utilizing in a manufacturing process of the above articles an aqueous dispersion of comprising ethyl vinyl acetate and carbon fibers. In these embodiments, the aqueous dispersion of the carbon fibers in the ethyl vinyl acetate can facilitate injection of the nanotubes into process equipment such as, for example, extruders.

In another aspect, the invention pertains to an article such as described above comprising a polymer and fluorinated carbon nanotubes, wherein the fluorinated carbon nanotubes provide increased resistance to chemical degradation.

In a further aspect, the invention pertains to a method of manufacturing articles as described above including forming a composite comprising injecting a liquid dispersion of carbon fibers within an extruder having a polymer within the extruder and applying shear to the blend of carbon fibers and polymer.

In addition, the invention pertains to a wafer carrier comprising slots for the support of a wafer, wherein the slots comprise wafer contact points having a surface with a composite of polymer covalently bonded to the carbon nanotubes.

In addition, the invention pertains to coating articles, components of articles such as described above with polymer associated with carbon nanotubes.

Furthermore, the invention pertains to a fuel cell comprising a bipolar plate comprising a composite of polymer and carbon nanotubes.

BRIEF DESCRIPTION OF THE DRAWINGS

FIG. 3 is a perspective view of a wafer container according to the invention herein.

FIG. 4 is a perspective view of a front opening wafer container according to the invention herein.

FIG. 5 is a side elevational view of the wafer container of FIG. 3.

FIG. 6 is a perspective view of a disk shipper according to the invention herein.

FIG. 7 is a perspective view of the cassette portion of the shipper of FIG. 6.

DETAILED DESCRIPTION OF THE INVENTION

Figure 1:
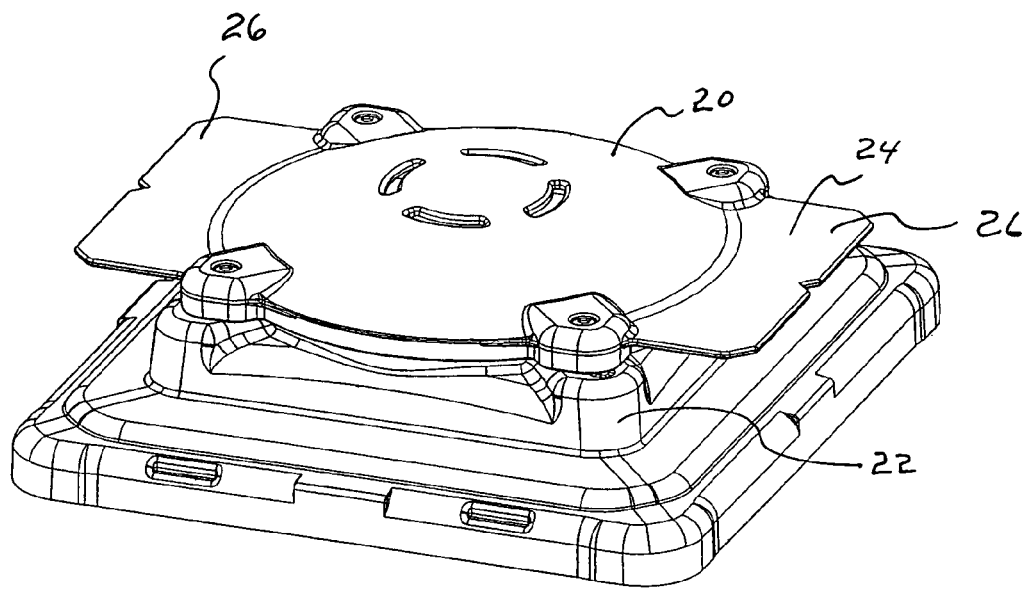
FIG. 1 is a perspective view of a reticle pod according to the invention herein.

Referring to FIGS. 1-6, several different configurations of substrate containers are illustrated. FIG. 1 illustrates a reticle pod 20 having an upper shell portion 22 with a bottom opening and a base or door sealably insertable into the bottom opening. See, for example, U.S. Pat. No. 6,825,916, owned by the owner of the instant application, for further disclosure of reticle pods. Said patent is incorporated herein by reference. The shell portion 22 includes a top portion configured as a flanged dome portion 24 with handles 26.

Figure 2:
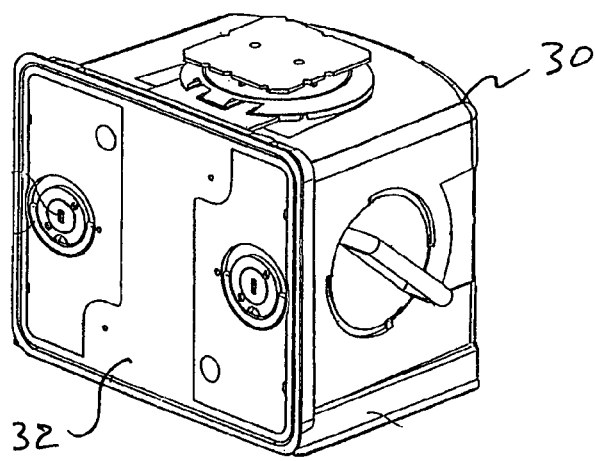
FIG. 2 is a perspective view of a front opening wafer container according to the invention herein.

FIG. 2 illustrates a wafer container known as a FOUP (acronym for front opening unified pod). Such a wafer container has a container portion 30 with a front opening and a door 32 sealably insertable and removable therefrom. Further disclosure on such containers may be found in U.S. Pat. Nos. 6,736,268 and 5,788,082, owned by the owner of the instant application. Said two patents are incorporated herein by reference.

FIGS. 3, 4 and 5 illustrate a WIP or work-in-process box 60 that typically include a bottom portion 66, an upper portion 64, a hinge 68, a latch 69, and an H-bar wafer carrier 62 sealed therein.

FIGS. 6 and 7 illustrate a disk shipper for substrates used in hard disk drives and has a cassette or base 76, a top cover 78, a bottom cover 79, and slots 84 in the cassette.

These substrate carriers are generally formed primarily of various polymers, for example polycarbonate, PEEK, fluoropolymers, and the like. Specific portions of these substrate carriers may be formed of compositions described below. Moreover, specific portions may be coated with compositions described below.

Improved compositions comprise a polymer and carbon fibers, such as nanotubes. In some embodiments, the carbon fibers, e.g., nanotubes, can be mechanically blended or incorporated into the polymer, while in some embodiments carbon nanotubes also may be covalently bonded to the polymer to form corresponding covalent materials. In particular, the polymer can be covalently bonded to the side walls of the carbon nanotubes to form a composite with particularly desirable mechanical properties. Specifically, the bonding of the polymer to the nanotube sidewall can provide desirable mechanical properties of the composite due to the orientation relative to other types of association between the nanotubes and the polymer. The processing of the nanotubes can be facilitated by the dispersion of the nanotubes in an aqueous solution comprising a hydrophylic polymer, such as ethyl vinyl acetate. A dispersion of nanotubes can be combined with a polymer in an extrusion process to blend the materials under high shear, such as in an extruder. In general, various articles can be formed that take advantage of the properties of the composite materials incorporating a polymer and carbon fibers, such as carbon nanotubes. Also, fluorinated nanotubes can be used to further improved the properties of the composites for certain applications. For example, fluorination of the nanotubes can impart greater chemical inertness, transparency and water resistance.

Due to the presence of the carbon nanotubes or carbon fibers generally, the compositions can exhibit improved physical properties such as, electrical conductivity, enhanced tensile strength, thermal stability, resistance to chemical degradation, transparency and combinations thereof. The carbon nanotubes can be dispersed through the material, formed as a coating or incorporated into more elaborate structures. In some embodiments, the compositions can be used to form, for example, a container suitable for preventing electrostatic charge build up, which reduces the occurrence of electrostatic discharge (ESD) involving the products contained within the container. In other embodiments, the compositions can be used to form electrically conductive polymer structures such as biopolar plates, current collectors, battery pins, electrodes, gas diffusion electrodes and the like.

Carbon nanotubes are generally cylindrical forms of graphitic carbon that exhibit useful mechanical and electrical properties. In general, carbon nanotubes can exist as single wall and multiple wall structures. Single wall carbon nanotubes are tubular structures comprising a single graphene sheet, while multiple wall carbon nanotubes comprise multiple concentric graphene sheets. Single and multiple wall carbon nanotubes can be made, for example, by known catalytic chemical vapor deposition (CVD) techniques. For example, the synthesis of single wall carbon nanotubes by CVD is generally described in "Synthesis, Integration, and Electrical Properties of Individual Single-Walled Carbon Nanotubes," Kong et al., Applied Physics A, Volume 69, pp. 305-308 (1999), which is hereby incorporated by reference herein. Synthesis of multiple wall carbon nanotubes is generally described in "Rapid Synthesis of Carbon Nanotubes by Solid-State Metathesis Reactions," O'Loughlin et al., J. Phys. Chem. B, Volume 105, pp. 1921-1924 (2001), which is hereby incorporated by reference herein. Both forms of nanotubes are commercially available. For example, single wall nanotubes are available from CarboLex (Lexington, Ky.) and Carbon Nanotechnologies, Inc (Houston, Tex.), and multiple wall carbon nanotubes are available from Applied Sciences Inc. (Cedarville, Ohio). With respect to the materials described herein, in some embodiments, the nanotubes can be single wall carbon nanotubes, multiple wall carbon nanotubes or combinations thereof. The nanotubes can be agglomerated, for example into nanotube particles or nanotube wires, or they can be dispersed nanotubes or a combination thereof.

Additionally, carbon nanotubes can be functionalized to impart desired properties to the carbon nanotubes. For example, some functionalized nanotubes can be more easily dispersed into aqueous or nonaqueous dispersions, and some functionalized nanotubes can be covalently bonded to polymers. Furthermore, functionalized nanotubes can facilitate bonding with the polymer. Fluorine functionalized nanotubes can be incorporated into composites that can have increased resistance to chemical degradation and/or increased transparency.

Some functionalization of carbon nanotubes is thought to generally functionalize the nanotubes at their ends. In addition, carbon nanotubes can be functionalized along their side walls. Thus, these functionalizations provide for covalent bonding of the carbon nanotubes either at their ends and/or along the side walls. As described above, carbon nanotubes exhibit useful mechanical and electrical properties including electrical conductivity and tensile strength. For example, carbon nanotubes can conduct electricity better than copper or gold, and can have a tensile strength that is greater than the tensile strength of steel. It is believed that the increased tensile strength is a result of the three-dimensional carbon network that forms the structure of the nanotubes.

The composites of the present disclosure can comprise carbon fibers associated with a polymer, which can be formed into articles having improved properties. The improved properties of the articles can be attributed to both the properties of the nanotubes and the properties of the polymers. Generally, selection of a particular polymer or combinations of polymers can be made based on the desired properties of the final product. For example, the selection of a polymer can be based on desired structural properties such as, for example, tensile strength, elasticity, transparency, and the like. Suitable polymers for particular articles are described further below. As used herein, polymer refers to linear, branched and crosslinked covalent structures. While nanotubes are technically polymers, as used herein polymers do not include compounds with a rigid and unique tertiary structure, such as carbon nanotubes.

As discussed above, semi-conductor devices, as well as other products, may be susceptible to damage from electrostatic discharge (ESD). In theory, electrostatic potentials can exist whenever suitable electrical insulators or semi-conductors are present. Specifically, materials such as, for example, nylon, polyester, polyurethane, polyvinyl chloride and poly (tetrafluoroethylene), tend to build up static charges. The build up of electrostatic charges in containers made from these materials can result in electrical discharge to products, such as semi-conductor devices, located within the containers. While the amount of energy transferred through ESD is relatively small, significant damage can result to the products located in the containers. Furthermore, conventional conductive coatings, which can be applied to containers to reduce the occurrence of ESD, tend to be degraded by recycling processes, and therefore the recycled or refurbished containers have to be re-coated with the conductive coating or replaced. As described herein, one way of reducing ESD in containers and other products is to form the containers form an electrically conducting composite composition comprising a polymer associated with carbon nanotubes.

Polymer—Carbon Fiber Compositions

As described above carbon fibers can be incorporated into, for example, polymer composites to provide desired mechanical and electrical properties by covalently bonding the carbon fibers to the polymer and/or by dispersing the fibers in a polymer. In some embodiments, the carbon fibers can be nanotubes, such as single wall carbon nanotubes multiple wall carbon nanotubes, or combinations thereof. Carbon nanotubes, which are generally cylindrical forms of carbon, can be covalently bonded to polymer systems by functionalizing the ends and/or the side walls of the carbon nanotubes, and subsequently reacting the functionalized nanotube with an appropriate polymer. Additionally or alternatively, the carbon nanotubes can be incorporated into a polymer system by dispersing the carbon nanotubes in a suitable polymer. In some embodiments, the carbon nanotubes can also be functionalized to facilitate dispersion in desired polymer systems. Dispersing and/or covalently bonding the carbon nanotubes into polymer systems can provide good incorporation and uniformity of the nanotubes throughout the polymer, which can enhance the mechanical and/or electrical properties of the polymer.

Carbon fibers are chemically resistant, rigid structures that can be used to produce articles such as, for example, tennis rackets, bicycles and golf clubs. For industrial uses, the carbon fibers can be formed into structures, such as sheets or other shapes. Carbon fibers can be produced from organic polymers such as, for example, poly(acrylonitrile) that are stretched and oxidized to produce precursor fibers. The precursor fibers can then be heated in a nitrogen environment, which facilitates the release of volatile compounds and yields fibers that are primarily composed of carbon. Carbon fibers are commercially available in varying grades, which can have varying tensile strengths and weights. As used herein, carbon fibers can be a range of carbon fiber materials including, for example, carbon nanotubes. Carbon nanotubes are rolled up graphene sheets of carbon which exhibit useful mechanical and electrical properties. Generally, carbon nanotubes are described as comprising tubular graphene walls which are parallel to the filament axis. Additionally, carbon nanotubes can be hollow and can have ends caps which seal the tubular structure.

In some embodiments, the ends of single and multiple wall carbon nanotubes can be functionalized by treating the nanotubes with nitric acid ($HNO_3$) or a sulfuric acid ($H_2SO_4$)-nitric acid mixture, both of which are known to remove the end caps of the carbon nanotubes and introduce oxygen-containing functional groups such as carboxyl groups. The carboxyl groups can be further reacted to form other functional groups, which can then be used to covalently bind the carbon nanotubes to polymers or other compounds. For example, primary amines ($RNH_2$) can be reacted with carboxyl groups to form amide linkages using carbodimide chemistry, which can result CO—NH—R groups located on the ends of the nanotubes. Furthermore, nanotubes containing carboxyl groups can be refluxed in $SOCL_2$, which can covert the carboxyl groups into acyl chlorides that can be further reacted into polymer systems having, for example, amine or alcohol functional groups. Generally, the functionalization reactions can be conducted in a suitable solvent such as, for example, 1,2-dichlorobenzene.

Purification and end functionalization of carbon nanotubes are generally discussed in, for example, "Covalently Functionalized Nanotubes as Nanometer-Sized Probes in Chemistry and Biology," Wong et al., Nature, Volume 392, July, (1998), "Large-Scale Purification of Single-Wall Carbon Nanotubes: Process, Product, and Characterization," Rinzler et al., Applied Physics A, Volume 67, pp. 29-37 (1998), "Strong Luminescence of Solubilized Carbon Nanotubes," Riggs et al., J. Am. Chem. Soc., 122, 5879-5880 (2000), and "Oxygen-Containing Functional Groups on Single-Wall Carbon Nanotubes: NEXAFS and Vibrational Spectroscopic Studies," Kuznetsova et al., J. AM. Chem. Soc., Volume 123, pp. 10699-10704 (2001), all of which are hereby incorporated by reference herein.

Additionally, the carbon nanotubes can be functionalized along their sides walls, which can facilitate reacting the carbon nanotubes into desired polymer systems. Alternatively, the carbon nanotubes may be functionalized on both the ends and the side walls of the nanotubes. In some embodiments, the carbon nanotubes can be reacted with fluorine gas to fluorinate the side walls of the nanotubes. The fluorinated nanotubes can be further functionalized by reactions with nucleophiles such as amines, hydrazines and alkyl lithium compounds. These side wall derivatized carbon nanotubes are described further, for example, in Published U.S. Patent Application 2001/0031900A to Margrave et al., entitled "Chemical Derivatization Of Single-Wall Carbon Nanotubes To Facilitate Solvation Thereof: And Use Of Derivatized Nanotubes To Form Catalyzt-Containing Seed Materials For Use In Making Carbon Fibers," incorporated herein by reference. As described above, fluorinated carbon nanotubes can be incorporated into composites to provide increased resistance to chemical degradation and/or increased transparency.

The carbon nanotubes can also be incorporated into dispersions to facilitate processing of the nanotubes into desired articles and/or coating of the nanotubes onto articles. In some embodiments, the dispersion can comprise an aqueous dispersion of carbon nanotubes in ethyl vinyl acetate. Ethyl vinyl acetate is sold commercially under the trade name Bynel® by Dupont (Wilmington, Del.), under the trade name Plexar® by Equistar (Houston, Tex.), and under the trade name Evatane® by Atofina Chemicals (Philadelphia, Pa.). Generally, EVA is commercially available in various grades which can have varying vinyl acetate (VA) content (i.e., vinyl acetate monomer units in the polymer), density and meld indices. Suitable EVA formulations for use in the present disclosure include, for example, EVA formulations having a VA content from about 10 mole % to about 50 mole %, in further embodiments from about 15 mole percent to about 40 mole percent and in other embodiments from about 20 mole percent to about 35 mole percent. Additionally, suitable EVA formulations can have melt indices ranging from about 2.5 g/10 mn to about 800 g/10 mn at 190° C., using a 2.16 Kg load. The melt index is evaluated using the ASTM D1238 procedure, which is hereby incorporated by reference herein. In some embodiments, the EVA can have a density ranging form about 0.92 g/cm³ to about 0.95 g/cm³. A person of ordinary skill in the art will recognize that additional ranges and subranges of VA content, melt indices and density within the explicit ranges are contemplated and are within the present disclosure. The structure of EVA is shown below wherein the relative amounts of the two monomer units is represented by the n and m subscripts:

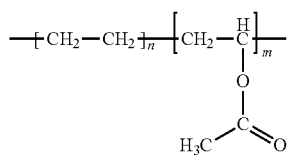

Below are tables displaying data for several grades of commercially available EVA formulations.

TABLE 1

| EVATANE® Grades | VA content (%) | Melt index (g/10 mn) | Melting point (° C.) |
| --- | --- | --- | --- |
| 24-03 | 23-25 | 2.5-3.5 | 79 |
| 28-03 | 26-28 | 3-4.5 | 75 |
| 28-05 | 27-29 | 5-8 | 73 |
| 28-25 | 27-29 | 22-29 | 72 |

TABLE 2

| Property | ASTM Test Method | Unit | Bynel(R) Grades | | | |
| --- | --- | --- | --- | --- | --- | --- |
| | | | 1123 | 1124 | 1E554 | 11E573 |
| Melt Index | D1238, 190/2.16 | dg/min | 6.4 | 25 | 8.0 | 6.9 |
| Density | D1505 | g/cm³ | 0.946 | 0.947 | 0.93 | 0.923 |
| Melt Point | DSC, D3418 | ° C. (° F.) | 74 (165) | 70 (158) | 94 (201) | 95 (203) |
| Freeze Point | DSC, D3418 | ° C. (° F.) | 51 (124) | 51 (124) | 76 (169) | 80 (176) |
| Vicat Softening Point | D1525 | ° C. (° F.) | 50 (122) | 49 (120) | 68 (154) | 71 (160) |

In other embodiments, the carbon nanotubes can be dispersed in poly(vinyl alcohol) (PVA). PVA is commercially sold under the trade name Elvanol® by Dupont (Wilmington, Del.), under the trade name Celvol™ by Celanese Chemicals (Dallas, Tex.), and from Erkol (Spain). Generally, suitable PVA formulations can have a molecule weight average from about 10,000 to about 190,000. Below is a table which displays data for suitable formulations of PVA. The PVA generally can have a density from about 1.27 to about 1.31 g/cm³. The melting point of the PVA generally can range from about 85 to about 200° C. A person of ordinary skill in the art will recognize that additional ranges within the explicit ranges of molecular weight, density and melting point are contemplated and are within the present disclosure.

The PVA can be partially or fully hydrolyzed. The structure of PVA is shown below wherein the relative amounts of the two monomer units is represented by the n subscript:

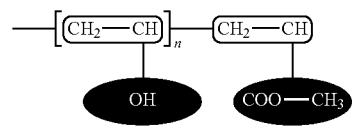

In general, PVA is formed commercially by the hydrolysis/saponification of poly vinyl acetate or other poly vinyl small aliphatic ester. The degree of hydrolysis determines relative amounts of vinyl alcohol monomer units in the polymer.

TABLE 3

| Grade Designations | Viscosity$^a$ | Percent Hydrolysis$^b$ | Solution pH | Volatiles, % max. | Ash, % max.$^c$ |
| --- | --- | --- | --- | --- | --- |
| Elvanol® 51-05 | 5-6 | 87-89 | 5.0-7.0 | 5 | 0.7 |
| Elvanol® 52-22 | 21-26 | 87-89 | 5.0-7.0 | 5 | 0.7 |
| Elvanol® 50-42 | 44-50 | 87-89 | 5.0-7.0 | 5 | 0.7 |

$^a$Viscosity in mPa·s (cP) of a 4% solids aqueous solution at 20° C. (68° F.), determined by Hoeppler falling ball method
$^b$Mole percent hydrolysis of acetate groups, dry basis
$^c$Dry basis: calculated as % Na$_2$O For blends of nanotubes with polymers, the presence of EVA or PVA can stabilize the adhesion or dispersion of the blend, especially for additional structural polymers such as polyolefins, polycarbonates, polystyrene, and acrylonitrile butadiene styrene copolymers. Similarly, other polyalcohols can be used. For example, soluble starches or other polysaccharides and derivatives thereof can be used. Also, other copolymers with varying degrees of vinyl monomers, vinylalcohol monomers, and/or vinyl ester monomers can be used if sufficiently soluble in aqueous solutions.

In other embodiments, the carbon nanotubes can be functionalized to increase the solubility of the nanotubes in desired polymers and/or solvents, which facilitates the formation of polymer/nanotube and/or solvent/nanotube dispersions. For example, as discussed above, carbon nanotubes can be treated with acid to form carboxyl groups on the ends of the nanotubes, which can be further reacted to form acyl chlorides. The acyl chlorides can be reacted with, for example, amines such as RNH$_2$, where R=(CH$_2$)$_n$CH$_3$ and n=9-50, which can increase the solubility of the nanotubes in organic solvents such as, for example, chloroform, dichloromethane, benzene, toluene, tetrahydrofuran, chlorobenzene and combinations thereof. Additional description of solubilizing carbon nanotubes can be found in U.S. Pat. No. 6,331,262 to Haddon et al., entitled "Method Of Solubilizing Shortened Single-Walled Carbon Nanotubes In Organic Solutions," which is hereby incorporated by reference herein.

Suitable polymers for use in the compositions of the present invention include homopolmyers, copolymers, block copolymers and blends and copolymers thereof. Suitable polymers include, for example, Polyetherimide (PEI), Polyimide (PI), Poly ether sulfone (PES), Poly phenyl sulfone (PPS), Poly sulfone, Polystyrene, Per fluoro alkoxy (PFA), Fluorinated Ethylene Propylene (FEP), ETFE, polybutylene terephthalate (PBT), polyolefins (PO), polyethylene trerphthalate (PET), styrene block co-polymers (e.g. Kraton®), styrene-butadiene rubber, nylon in the form of polyether block polyamide (PEBA), polyetheretherketone (PEEK), poly(vinylidenefluoride), poly(tetrafluoroethylene) (PTFE), polyethylene, polypropylene, poly(vinylchloride) (PVC), ethyl vinyl acetate, and blends and copolymers thereof. In general, the selection of a particular polymer for use in the composition will be guided by the intended application of the composition. In some embodiments, the polymers can be functionalized to contain functional groups suitable for reacting with the functional groups on the derivatized nanotubes to form composites where the nanotubes are covalently bonded to the polymers. Suitable functional groups include, for example, amines, alcohols, alkyl lithium compounds, hydrazines, and combinations thereof. Alternatively, the selected polymer can contain suitable functional groups such that functionalization of the polymer is not required. For example, polyamides such as nylon can contain un-reacted amine groups which can replace chloride groups on the functionalized nanotubes.

In general, the improved compositions comprise a polymer associated with carbon nanotubes. In some embodiments, the composition is not soluable in water and in particular, the polymer may not be soluble in water. Generally, the carbon nanotubes are present in a concentration less than about 50 percent by weight. In some embodiments, the carbon nanotubes are present in a concentration from about 0.1 percent by weight to about 40 percent by weight and in other embodiments the nanotubes can be present in a concentration form about 1 percent by weight to about 20 percent by weight. One of ordinary skill in the art will recognize that additional ranges within these explicit ranges are contemplated and are within the scope of the present disclosure.

In embodiments where preserving the transparency of the polymer is desired, the composition generally comprises carbon nanotubes at a concentration of less than about 0.5 percent by weight. Additionally, single wall carbon nanotubes tend to preserve transparency better than the multiple wall carbon nanotubes. In embodiments where it is desired to enhance the strength and/or thermal stability of the polymer, the carbon nanotubes can be incorporated into the polymer at a concentration from about 5 percent by weight to about 50 percent by weight. So for front opening wafer containers as illustrated in FIG. 2, desirable characteristics associated with the nanotubes, such as static dissipation, can be provided while maintaining transparency. Often the container portions are primarily transparent in these containers and providing suitable static dissipation characteristics is problematic.

Additionally, in some embodiments, the composition can further comprises additional components such as surfactants, fillers, processing aids, viscosity modifiers and the like. Generally, the additional components are each present at a concentration of no more than about 5 percent by weight. In particular, some embodiments of the present invention may comprise liquid dispersions of carbon nanotubes in a solvent. In these embodiments, the solvent can be removed during and/or after processing such that the final polymer/nanotube composite comprises less than 1 percent by weight of the solvent.

In some embodiments, the composition can comprise some or all of the carbon nanotubes covalently bonded to the polymer. Specifically, the composites can comprise at least about 25 weight percent of the carbon nanotubes being covalently bonded to the polymer, in further embodiments at least about 40 weight percent, in additional embodiments at least about 75 weight percent and in other embodiments at least about 95 weight percent of the carbon nanotubes are covalently bonded to the polymer. A person of ordinary skill in the art will recognize that additional ranges of covalent bonding amounts within the explicit ranges are contemplated and are within the present disclosure. Reacting the carbon nanotubes into a polymer can increase the dispersion of the nanotubes throughout the polymer and permits an atomic level order of the carbon nanotubes.

In general, the molecular weights of the polymers, the number of functional groups on the polymers, the relative amounts of the nanotubes and the polymer and the like influence the chemical structure of the composites. Similarly, these features can be adjusted to obtain a composite with desired properties. For example, the functionalized nanotubes can be used to cross link multifunctional polymers, such that the polymer chains are connected by the carbon nanotubes. In some embodiments, self-ordering composites can be formed with properties reminiscent of block copolymers can be formed.

The composite structures can be formed under processing conditions that involve generally predictable bonding of the polymer with the nanotubes. For example, the polymers can have a single functional group for bonding with the functionalized nanotubes. The molecular weights of the polymers can be selected to yield appropriate structures in view of the sizes of the nanotubes. The processing conditions and the functionalization can be controlled to generally form structures with a single polymer chain bonded with a single nanotube. By analogy with polymer block copolymers, this polymer-block-nanotube structure can exhibit standard block copolymer behavior with the nanotubes having the properties of one block and the polymer having the properties of a second block. Similar, multiple block structures can be formed These blocked structures can exhibit self-ordering.

Composite Processing

The compositions of the present disclosure, which generally comprise carbon nanotubes associated with a polymer, can be processed directly into desired articles by processes such as extrusion, injection molding and the like and/or can be incorporated into a process to provide a coating or layer on a preformed article. In some embodiments, the carbon nanotube can be associated with the polymer by mechanically blending or mixing the nanotubes into a polymer. In other embodiments, the carbon nanotubes can be functionalized and reacted with a polymer to form a polymer/carbon nanotube composite structure. As described above, functionalizing the nanotubes can make the nanotubes more dispersable in a polymer, which can increase the uniformity of the nanotubes throughout the polymer. In some embodiments, the composites can be produced and the articles formed in one continuous process, while in other embodiments the production of the composite and the formation of an article from the composite can be done separately.

In general, the bonding between a functionalized carbon nanotube and a suitable polymer can be performed in solution, in a polymer melt or some combination thereof, such as the blending of a carbon nanotube dispersion and polymer melt. In general, the nanotubes are mixed through the polymer composition to form a roughly uniform composition. A significant amount of shear may be applied to combine the materials.

In some embodiments, to form a polymer/nanotube composite, a liquid nanotube dispersions can be formed and injected into an extruder having a polymer within the extruder, wherein the extruder can provide shear to blend the carbon nanotubes within the polymer to obtain a composite having suitable mixing of the nanotubes throughout the polymer. As described further below, it may be desirable to include a hydrorphylic polymer, in particular ethyl vinyl acetate, to facilitate dispersion of the carbon nanotubes. In other embodiments, the nanotubes can be introduced into an extruder in an agglomerated particle form by using a solid feeder or the like, and combined with a polymer located within the extruder to form a nanotube/polymer composite. In general, suitable extruders are available commercially. The extruder can be a single screw or multiple screw extruder, such as a two screw extruder. Suitable commercial extruders include, for example, Berstorff model ZE or KE extruders (Hannover, Germany), Leistritz model ZSE or ESE extruders (Somerville, N.J.) and Davis-Standard mark series extruders (Pawcatuck, Conn.).

In general, dispersions can be formed with the carbon nanotubes in aqueous or nonaqueous dispersants. Processing aids can be used, such as surfactants and the like. In particular, the dispersion can comprise an aqueous dispersion of carbon nanotubes and ethyl vinyl acetate. It has been discovered that ethyl vinyl acetate (EVA) can stabilize an aqueous dispersion of carbon nanotubes. In other embodiments, the dispersion can comprise an aqueous dispersion of carbon nanotubes and a poly alcohol. Generally, any poly alcohol that is soluble or partially soluble in water can be used to form the dispersions. In one embodiment, the dispersion can comprise an aqueous dispersion of carbon nanotubes in poly(vinyl alcohol) (PVA). In some embodiments, the polymer/nanotubes dispersion can comprise a weight ratio of polymer to nanotubes from about 0.005 to about 1, while in other embodiments from about 0.01 to about 0.67. One of ordinary skill in the art will recognize that additional ranges of concentration ratios of polymer to nanotubes within these explicit ranges are contemplated and are within the scope of the present disclosure. In some embodiments, to form the liquid nanotube dispersions, desired amounts of nanotubes and liquid along with an optional polymer such as EVA and/or PVA, can be combined and mixed by any suitable processing apparatus such as a blender, mixer or the like. The liquid nanotube dispersion can then be injected into an extruder or a high shear mixer and mixed with a polymer material that is present in the extruder/mixer. Generally, any liquids used to form the polymer/nanotube dispersion can be evaporated during the extrusion process such that the final composite is substantially free of solvents, processing aids and other liquids. Vapors from the liquid can be vented from the extruder as appropriate. In general, the polymer in the extruder can be introduced into the extruder by, for example, a hopper or other feeding apparatus, and the feeding apparatus can be heated to facilitate the process by softening the polymer.

Generally, the extruder can apply shear forces to the nanotube polymer mixture such that the nanotubes are mixed throughout the polymer to form a nanotube/polymer composite. In embodiments employing functionalized nanotubes, the shear forces applied by the extruder can promote reaction of the nanotubes with a suitable polymer(s) to form a composite structure in which the nanotubes are covalently attached to the polymer. Additionally, the nanotube/polymer composite can be directly processed into articles having desired size and shape by processes such as, for example, calandering, injection molding, compression molding and the like. For example, the composite can be feed from the extruder to a injection molding or compression molding apparatus such that the production of the nanotube/polymer composite and the formation of an article from the composite is a single process. In other embodiments, the extruder can be used to form an article by injecting the composite through a die and calandering the composite to form an article having a desired shape. One of ordinary skill in the art will recognize that the selection of a particular shaping process can be guided by the intended application of a particular article. Alternatively, the composite formed in the extruder or other mixing apparatus can be collected in pellets or other desirable form and stored for subsequent processing into a final article.

In one embodiment, the nanotube/polymer composite can be feed from the extruder to an injection molding apparatus where the composite can be formed into a bipolar plate suitable for use in electrochemical cell applications. In these embodiments, the mold can be designed such that the bipolar plate has reactant flow channels formed into each side of the plate suitable for providing flow path for gasses. In other embodiments, the polymer/nanotube composite can be feed from the extruder to a mold where the composite can be molded into a container suitable for transporting semi-conductor wafers. In these embodiments, the mold can designed such that the container has structural elements suitable for supporting the semi-conductor wafers.

In further embodiments, the carbon nanotubes/polymer composite can be coated onto an article by coating the article with a solvent/composite mixture or by forming the composite into a thin film that is laminated or calendered onto the surface of the structure. For solution based approaches, once the solvent evaporates, the carbon nanotubes/polymer composite can be deposited onto a surface of the article. In these embodiments, any appropriate means for coating can be used to apply the solvent/composite mixture to the article including, for example spraying, dip coating or the like. Additionally, in these embodiments, the solvent/dispersant can be, for example, a suitable commercially available solvent that can disperse or suspend the carbon nanotubes/polymer composite. In some embodiments, the solvent may be a non-polar solvent such as, for example, 1,2-dichlorobenzene. The solubility of single wall carbon nanotubes is generally discussed in, for example, "Dissolution of Small Diameter Single-Wall Carbon Nanotubes In Organic Solvents?," Bahr et al., Chem. Commun., pp. 193-194 (2001), which is hereby incorporated by reference herein. The polymer coated carbon nanotubes can then be used to coat an article such as, for example, a wafer carrier to provide an electrically conductive coating on the carrier.

Articles Formed from Composites

Articles, such as substrates, carriers, fluid handling equipment (such as valves, filters, filter housings, and sensors), electrodes, electrically conductive elements for electrochemical cells and the like, can be formed totally or partially from the polymer/carbon nanotube compositions described herein. Additionally or alternatively, articles such as disclosed herein, can be coated with a polymer/carbon nanotube composition to form a layer on the surface of the article. In further embodiments, a coating comprising carbon nanotubes dissolved or suspended in a solvent can be applied to articles disclosed herein to form a coating on the surface of the article. Articles formed by polymer/nanotube composites and/or articles having a nanotube coating can have enhanced electrical and mechanical properties. Due to improved wear properties, some articles such as, containers, made from coating of polymer/nanotube composites can be refurbished and/or reused without a significant reduction of the mechanical and electrical properties of the container over reasonable periods of time.

In some embodiments, the polymer/carbon nanotube composition can be formed into a container by injection molding, compression molding or the like. In some embodiments, the containers can have structure on the interior of the container suitable for holding a plurality of products in a desired orientation within the container. For example, the container can be designed to hold a plurality of semi-conductor devices, while in other embodiments the container may be design to hold silicon wafers. A container designed to hold silicon wafers is described in, for example, U.S. Pat. No. 6,428,729 to Bhatt et al., entitled "Composite Substrate Carrier," owned by the owner of the instant invention, which is hereby incorporated by reference herein. Additionally, a tray for semiconductor devices is described in application Ser. No. 10/194,948, filed on Jul. 12, 2002, entitled "Tray for Semiconductors," which is hereby incorporated by reference herein. Due to the carbon nanotubes, the containers, carriers or appropriate surfaces thereof or portions thereof can be electrically conductive and can reduce the build up of electrostatic charges, which may reduce the occurrence of ESD damage to the products contained within the container. In some embodiments, the wafer carrier or trays can comprise slots for supporting semi-conductor wafers, and the slots can comprise wafer contacts points having a surface with a composite of polymer associated with carbon nanotubes. The carbon nanotubes can be covalently attached to the polymer, blended into the polymer to form a physical composite, or a combination thereof. Since low levels of carbon nanotubes may be effective to generate desired levels of electrical conductivity especially if applied as a coating, the containers made out of the compositions of the present disclosure can have the ability to reduce ESD without the transparency of the container being compromised.

The machine interfaces, typically a kinematic coupling can be formed of or coated with the polymer nanotube compositions to provide enhanced performance characteristics.

In other embodiments, a product such as a container can be formed from a thermoplastic material, and subsequently coated with a coating layer comprising a polymer associated with carbon nanotubes. In some embodiments, the product can be composed of the same polymer used to form the coating layer, while in other embodiments the polymer used to form the product can be a different polymer than the polymer used to form the coating layer. In these embodiments, the product can be coated with the coating layer by any suitable means including, for example, dip coating, spray coating, brushing, calendering, knife coating and/or the like. In some embodiments, the coating layer can be from about 0.0005 inches to about 0.005 inches thick, although a person of ordinary skill in the art will recognize that additional ranges within the explicit range are contemplated and are within the present disclosure.

In further embodiments, the polymer/carbon nanotube compositions can be used to form electrically conductive structures such as bipolar plates, electrodes, gas diffusion electrodes for fuel cells, current collectors, components thereof and the like. In general, bipolar plates of a fuel cell are electrically conductive structures that electrically connect the anode of one electrochemical cell with the cathode of an adjacent electrochemical cell. Additionally, in a hydrogen/oxygen fuel cell, the bipolar plates generally have channels that provide flow pathways for oxygen to reach the cathode and hydrogen to reach the anode. For example, a bipolar plate can have horizontal channels on one side of the plate and vertical channels on the other side of the plate. The plates can be formed, for example, by injection molding or compression molding. In addition to providing electrical conductivity, the bipolar plates formed from compositions comprising carbon nanotubes can have greater mechanical strength, resistance to chemical degradation and thermal stability compared with bipolar plates formed from other materials. Bipolar plates suitable for use in electrochemical cell applications are disclosed, for example, in U.S. Pat. No. 6,677,071 to Yang, entitled "Bipolar Plate For A Fuel Cell," and U.S. Pat. No. 6,503,653 to Rock, entitled "Stamped Bipolar Plate For PEM Fuel Cell Stack," which are hereby incorporated by reference herein.

The polymer/nanotube compositions of the present disclosure can also be used to form electrode structures suitable for use in electrochemical cell applications. Generally, electrodes can comprise an active layer associated with a backing layer. The backing layer can be impervious to electrolyte but preamble to gas, while the active layer can be a porous structure comprising catalyst particles suitable for catalyzing the electrochemical reactions, conductive particles and a porous particle binder. In some embodiments, the polymer/nanotube composite can be processed, along with suitable catalytic particles, to form a porous active layer, which can be attached to a backing layer by adhesives or lamination to form an electrode structure. Suitable catalyst particles include, for example, platinum powders.

Generally, products, such as containers, made from a polymer/carbon nanotube composition, or products coated with a polymer/carbon nanotube composition, can be reused repeatedly, i.e., recycled without losing the electrically conductive properties. Thus, products made from the compositions of the present disclosure can be recycled and formed into recycled products, which retain the electrical products of the original product through many uses. Thus, the products may be less expensive to use relative to products that can only be used one or a few times without reapplying the electrically conductive coating.

The embodiments above are intended to be illustrative and not limiting. Additional embodiments are within the claims. Although the present invention has been described with reference to particular embodiments, workers skilled in the art will recognize that changes may be made in form and detail without departing from the spirit and scope of the invention.

I claim:

1. A method of forming a substrate carrier, the method comprising the steps of:
    preparing a liquid dispersion of carbon fibers, wherein the carbon fibers have side walls and ends and comprise single wall carbon nanotubes, multiple wall carbon nanotubes, or a combination thereof, the side walls of the carbon fibers, exclusive of the ends, being functionalized such that they comprise functional groups on an exterior of the side walls for covalently bonding with a thermoplastic polymer,
    injecting the liquid dispersion of carbon fibers within an extruder having the thermoplastic polymer within the extruder, wherein the liquid dispersion of carbon fibers comprises an aqueous dispersion of carbon fibers and a stabilizer selected from a group consisting of ethyl vinyl acetate, poly(vinyl alcohol) and combinations thereof,
    applying shear to blend the carbon fibers within the thermoplastic polymer and covalently bond the thermoplastic polymer to side walls of the carbon fiber to form a composite, wherein at least about 25 weight percent of the carbon fibers are covalently bonded to the thermoplastic polymer, and injecting the composite into a mold for a substrate carrier component.

2. The method of claim 1 wherein the carbon fibers are present at a concentration of less than about 50 percent by weight.

3. The method of claim 1 wherein the carbon fibers are present at a concentration from about 0.1 percent by weight to about 40 percent by weight.

4. The method of claim 1 wherein the side walls of the carbon fibers are functionalized by being fluorinated for covalently bonding with the thermoplastic polymer.

5. The method of claim 1, wherein the thermoplastic polymer is chosen from polybutylene terephthalate (PBT), polyolefins (PO), polyethylene terephthalate (PET), styrene block co-polymers, nylon in the form of polyether block polyamide (PEBA), polyetheretherketone (PEEK), poly(vinylidenefluoride), poly(tetrafluororethylene) (PTFE), polyethylene, polypropylene, poly(vinylchloride) (PVC), ethyl vinyl acetate and blends and copolymers thereof.

6. A method of forming a substrate carrier, the method comprising the steps of:

preparing a liquid dispersion of carbon fibers, wherein the carbon fibers have side walls and ends and comprise single wall carbon nanotubes, multiple wall carbon nanotubes, or a combination thereof, the side walls of the carbon fibers, exclusive of the ends, being functionalized such that they comprise functional groups on an exterior of the side walls for covalently bonding with a thermoplastic polymer, wherein the liquid dispersion of carbon fibers comprises an aqueous dispersion of carbon fibers and a stabilizer selected from a group consisting of ethyl vinyl acetate, poly(vinyl alcohol) and combinations thereof, injecting the liquid dispersion of carbon fibers within an extruder having the thermoplastic polymer within the extruder, applying shear to blend the carbon fibers within the thermoplastic polymer and covalently bond the thermoplastic polymer to the side walls of the carbon fiber to form a composite, wherein at least about 25 weight percent of the carbon fibers are covalently bonded to the thermoplastic polymer, and feeding the composite from the extruder and apply a coating of the composite onto a surface of a substrate carrier.

7. The method of claim 6 wherein the carbon fibers are present at a concentration of less than about 50 percent by weight.

8. The method of claim 6 wherein the carbon fibers are present at a concentration from about 0.1 percent by weight to about 40 percent by weight.

9. The method of claim 6 wherein the side walls of the carbon fibers are functionalized by being fluorinated for covalently bonding with the thermoplastic polymer.

10. The method of claim 6, wherein the thermoplastic polymer is chosen from polybutylene terephthalate (PBT), polyolefins (PO), polyethylene terephthalate (PET), styrene block co-polymers, nylon in the form of polyether block polyamide (PEBA), polyetheretherketone (PEEK), poly(vinylidenefluoride), poly(tetrafluororethylene) (PTFE), polyethylene, polypropylene, poly(vinylchloride) (PVC), ethyl vinyl acetate and blends and copolymers thereof.

* * * * *

UNITED STATES PATENT AND TRADEMARK OFFICE
CERTIFICATE OF CORRECTION

| | | |
|---|---|---|
| PATENT NO. | : 8,652,391 B2 | Page 1 of 1 |
| APPLICATION NO. | : 11/509419 | |
| DATED | : February 18, 2014 | |
| INVENTOR(S) | : Bhatt | |

It is certified that error appears in the above-identified patent and that said Letters Patent is hereby corrected as shown below:

In The Claims

In Column 15, Claim 2, Line 6, delete "claim 1 wherein" and insert -- claim 1, wherein --, therefor.

In Column 15, Claim 3, Line 9, delete "claim 1 wherein" and insert -- claim 1, wherein --, therefor.

In Column 15, Claim 4, Line 12, delete "claim 1 wherein" and insert -- claim 1, wherein --, therefor.

In Column 16, Claim 7, Line 16, delete "'claim 6 wherein" and insert -- claim 6, wherein --, therefor.

In Column 16, Claim 8, Line 19, delete "claim 6 wherein" and insert -- claim 6, wherein --, therefor.

In Column 16, Claim 9, Line 22, delete "claim 6 wherein" and insert -- claim 6, wherein --, therefor.

Signed and Sealed this
Seventh Day of April, 2015

Michelle K. Lee
*Director of the United States Patent and Trademark Office*